United States Patent
Brunner et al.

(10) Patent No.: US 8,001,495 B2
(45) Date of Patent: Aug. 16, 2011

(54) SYSTEM AND METHOD OF PREDICTING PROBLEMATIC AREAS FOR LITHOGRAPHY IN A CIRCUIT DESIGN

(75) Inventors: Timothy A. Brunner, Ridgefield, CT (US); Stephen E. Greco, Lagrangeville, NY (US); Bernhard R. Liegl, Beacon, NY (US); Hua Xiang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 584 days.

(21) Appl. No.: 12/104,585

(22) Filed: Apr. 17, 2008

(65) Prior Publication Data

US 2009/0265679 A1 Oct. 22, 2009

(51) Int. Cl.
G06F 17/50 (2006.01)
G03C 5/00 (2006.01)
G03F 1/00 (2006.01)

(52) U.S. Cl. ........... 716/55; 716/51; 716/52; 716/53; 716/54; 716/56; 716/110; 716/111; 716/112; 716/136; 430/5; 430/30; 430/394

(58) Field of Classification Search ............... 716/1, 2, 716/4, 5, 6, 19, 20, 21; 355/55, 67; 430/5, 430/30, 394
See application file for complete search history.

(56) References Cited

U.S. PATENT DOCUMENTS

| | | | | |
|---|---|---|---|---|
| 4,890,239 A * | 12/1989 | Ausschnitt et al. | ............ | 430/30 |
| 5,325,129 A * | 6/1994 | Henry et al. | .................. | 348/571 |
| 5,415,952 A * | 5/1995 | Haruki et al. | ..................... | 430/5 |
| 5,502,311 A * | 3/1996 | Imai et al. | ..................... | 250/548 |
| 5,646,870 A * | 7/1997 | Krivokapic et al. | ............. | 716/4 |
| 5,952,160 A * | 9/1999 | Bakeman et al. | ............. | 430/394 |
| 6,277,533 B1 * | 8/2001 | Wakamoto et al. | ............. | 430/30 |
| 6,476,886 B2 * | 11/2002 | Krusius et al. | .................. | 349/73 |
| 6,563,566 B2 * | 5/2003 | Rosenbluth et al. | ............ | 355/67 |
| 6,686,130 B2 * | 2/2004 | Hayasaki et al. | ............. | 430/322 |
| 6,746,128 B2 * | 6/2004 | Kemp | ........................... | 359/858 |
| 6,862,141 B2 * | 3/2005 | Olczak | ......................... | 359/621 |
| 6,901,564 B2 * | 5/2005 | Stine et al. | ......................... | 716/4 |
| 6,944,578 B2 * | 9/2005 | Bowley et al. | ................ | 702/189 |
| 7,193,685 B2 * | 3/2007 | Miura | ............................. | 355/55 |
| 7,292,311 B2 * | 11/2007 | Kurosawa | ....................... | 355/53 |
| 7,440,081 B2 * | 10/2008 | Gui et al. | ........................ | 355/72 |
| 2006/0087634 A1 * | 4/2006 | Brown et al. | ..................... | 355/69 |
| 2008/0216027 A1 * | 9/2008 | White et al. | ..................... | 716/4 |
| 2009/0031261 A1 * | 1/2009 | Smith et al. | ...................... | 716/2 |

OTHER PUBLICATIONS

US 7,039,895, 05/2006, White et al. (withdrawn)

\* cited by examiner

*Primary Examiner* — Helen Rossoshek
(74) *Attorney, Agent, or Firm* — Ian D. MacKinnon; Roberts Mlotkowski Safran & Cole, P.C.

(57) ABSTRACT

A system and method is provided which predicts problematic areas for lithography in a circuit design, and more specifically, which uses modeling data from a modeling tool to accurately predict problematic lithographic areas. The method includes identifying surface heights of plurality of tiles of a modeled wafer, and mathematically mimicking a lithographic tool to determine best planes of focus for exposure for the plurality of tiles.

10 Claims, 9 Drawing Sheets

Slit scans along the reticle field in the direction of the arrow

SYSTEM AND METHOD OF PREDICTING PROBLEMATIC AREAS FOR LITHOGRAPHY IN A CIRCUIT DESIGN

FIELD OF THE INVENTION

The present invention generally relates to a system and method of predicting problematic areas for lithography in a circuit design, and more specifically, to a system and method which uses modeling data from a modeling tool to accurately predict problematic lithographic areas.

BACKGROUND OF THE INVENTION

Today's complex semiconductor chips can have ten or more levels of metallization. Since some degree of surface non-planarity is typically introduced at each level, the surface non-planarity, in general, will become greater as more metal levels are fabricated. A three dimensional surface height map of one chip is shown in FIG. 1. The map shown in FIG. 1 was generated using data obtained from a lithography tool prior to exposure of an upper metal level. The peak of FIG. 1 represents a surface irregularity, which represents a bad focus area. It should be recognized though, that other peaks of FIG. 1 may represent irregularities in the surface, but these peaks do not necessarily represent a bad area of focus as this would depend on the focal planes used by the lithography tool.

Lithography tools used today expose wafers by scanning a slit (essentially a long rectangular opening through which light passes through the reticle, through lens elements, and onto the wafer) across the reticle field. Using optical or mechanical sensors, the lithography tool continuously reads the position of the wafer surface at multiple points within the slit as it scans, or reads the entire wafer surface prior to scanning. The tool must choose and expose with a best average focal plane across the slit.

Previous generation tools, e.g., single stage lithography tools, measure the surface topography in real time, during the exposure scan, but newer, multiple stage tools can pre-measure the entire wafer surface on the "idle" stage prior to the exposure scan, for increased throughput. The plane of exposure can be moved up and down, and rotated around two axes in order to achieve the best average focal plane at any particular instant, which is continually adjusted as the slit scans.

FIGS. 2 and 3 show two dimensional surface profiles, taken by measuring the surface height along a surface. FIG. 2, in specific, is a two dimensional surface profile taken by measuring the surface height in a direction over the large surface "peak" in FIG. 1. (It should be recognized that the profile is not meant to be an accurate representation of the surface height data and is provided for illustrative purposes only). FIG. 2 also shows a two dimensional representation of the plane, seen on edge, that the lithography tool might choose as the best average focal plane, if it had to consider only this single two dimensional profile. As should be understood by those of skill in the art, the exposure plane shown by the line in FIG. 2 can be tilted (in a direction towards and away from the surface of the paper) in order to provide a better focus for some points on the surface of the wafer.

Some areas of the photoresist film which cover the wafer surface at the time of exposure, will inevitably be in better focus than other areas. For example, point A is obviously furthest from the best average focal plane (e.g., the distance along the axis of illumination from the best average focal plane), and point A will therefore have the worst average focus, for points along this particular profile. Point B, on the other hand, should have much better average focus than point A. Since chip designs can vary widely, an infinite variety of surface profiles are possible.

The surface topography can be modeled by empirical commercial chemical mechanical polishing (CMP) modeling programs which take into account the details of the metal pattern at a particular level and also the underlying topography from prior levels. In one example, the design data is fed into the modeling program (after model setup/calibration is performed), and the model output is a surface height above a reference point, anywhere in the chip design. In this example, the surface height is the weighted average of the average copper height and the average dielectric height about a certain reference point. Typically the copper thickness, dielectric thickness, and surface height are mapped in terms of square regions of a specific size (tiles); although, it is understood that the results can be mapped and viewed in various ways.

However, current modeling cannot accurately predict all of the areas that will be problematic for lithography. For example, current methodologies involve simply looking for high or low points within the CMP modeling surface height data, without taking into consideration the way in which the lithography tool decides the focal planes to use as it scans. More specifically, using the empirical modeling data and referring back to FIG. 3, the points indicated by the arrows labeled "C" and "D" which have the same height above some reference plane, might be considered to be "high" points along the curve (along the surface profile), at risk of bad focus (they are higher than most points along the curve). But because of the way that the lithography tool must select the best average focal plane (simulated on edge by the line labeled "Best Average Focal Plane"), the point indicated by the arrow labeled "C" will be exposed with much better focus than the point indicated by the arrow labeled "D". Therefore surface height alone is not necessarily an accurate indicator of whether focus will be good or poor. Also, the point indicated by the arrow labeled "E" is a peak with respect to its immediate surroundings, yet it will be exposed with good focus. Therefore identification of such local "peaks" or "dips" is not necessarily an accurate indicator of whether focus will be good or poor.

Accordingly, there exists a need in the art to overcome the deficiencies and limitations described hereinabove.

SUMMARY OF THE INVENTION

In a first aspect of the invention, a method of predicting problematic areas for lithography comprises identifying surface heights of a plurality of tiles of a modeled wafer; and mathematically mimicking a lithographic tool to determine best planes of focus for exposure for the plurality of tiles.

In embodiments, the average distance of the surface heights of the plurality of fields of exposure for each tile is a three dimensional representation of the surface texture at a location on the modeled wafer. The identifying surface heights determines a three dimensional texture of the modeled wafer. The identifying is performed by a modeling tool prior to reticle and wafer fabrication. In further embodiments, the method predicts an average distance of the surface heights of a plurality of fields of exposure for each of the plurality of tiles. This includes calculating a predetermined number of focal planes for each tile in a reticle field. Each of the predetermined number of focal planes contributes to an equal percentage of exposure dose for an entire tile. The predetermined number of focal planes are used to measure surface irregularity in three dimensions. The predetermined number of focal planes is different planes of exposure. Each of the plurality of fields of exposure is calculated to find an average focus offset by calculating an average distance along an axis of illumination from a best average focal plane. The method further comprises identifying tiles with an average focus offset with a value above a certain specification distance related to a depth of focus for a lithography process, and providing the calculated average offset data to a mask tool.

In a further aspect of the invention, a method comprises calculating a plane which best fits modeled surface height data for a predetermined number of values within a slit. The method further comprises calculating a distance along the axis of illumination distances of each tile within the slit from the calculated plane. The tiles which are above a certain specification distance related to a depth of focus are identified for a lithography process based on the calculated distance along the axis of illumination.

In yet another aspect of the invention, a computer program product comprises a computer usable medium having readable program code embodied in the medium. The computer program product includes at least one component to: identify surface heights of one or more tiles of a modeled wafer; and mathematically mimicking a lithographic tool to determine best planes of focus for exposure for the one or more tiles In still another aspect of the invention, a design structure is embodied in a machine readable medium for designing, manufacturing, or testing an integrated circuit. The design structure comprises: calculating a plane which best fits modeled surface height data for a predetermined number of values within a slit; calculating a distance along the axis of illumination distances of each tile within the slit from the calculated plane; and identifying tiles which are above a certain specification related to a depth of focus for a lithography process based on the calculated distance along the axis of illumination.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE INVENTION

The present invention generally relates to a system and method of predicting problematic areas for lithography in a circuit design, and more specifically, to a system and method which uses modeling data from a CMP modeling tool to accurately predict problematic lithographic areas. In embodiments, the system and method of the invention is configured to make the predictions prior to the fabrication of the reticles and/or wafers. In this way, the reticle can be fabricated using the data obtained thus significantly improving the features patterned on the wafer by use of the designed reticle. The predictions can be made using a computing infrastructure, as discussed in greater detail below.

Illustrative Environment for Implementing Processes

Figure 4:
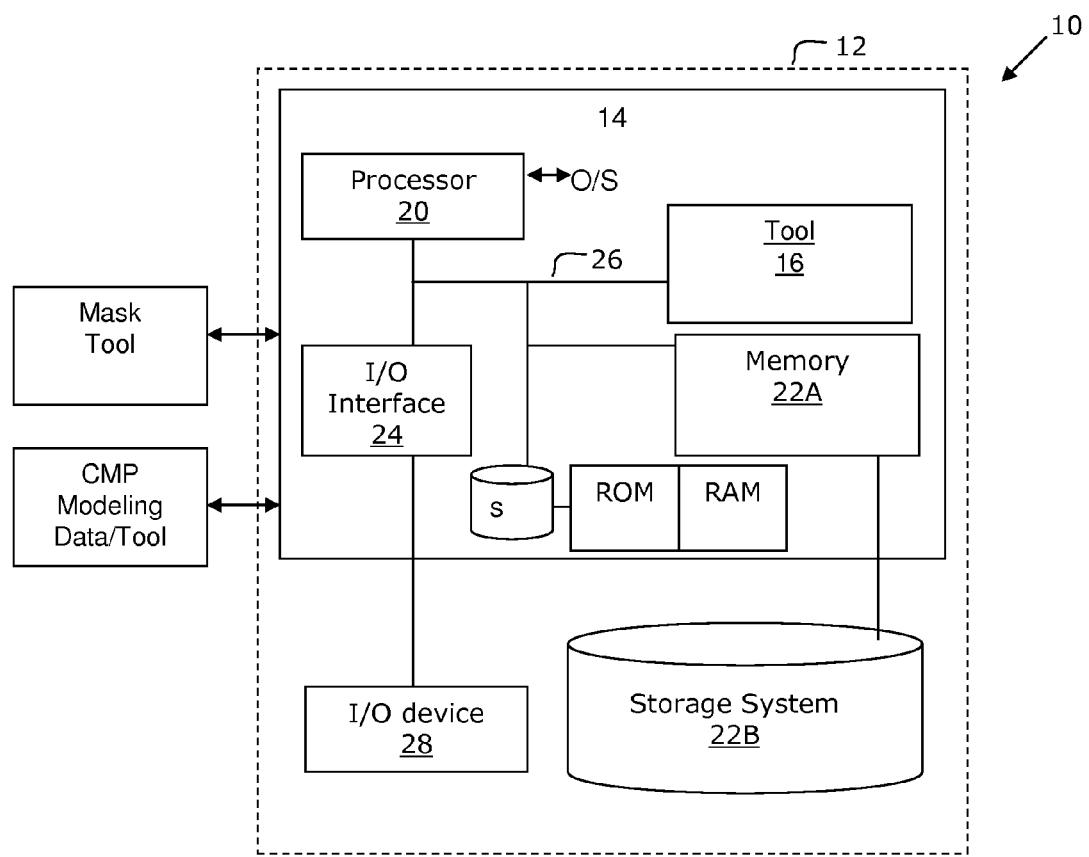
FIG. 4 shows an illustrative environment for implementing features in accordance with aspects of the invention.

FIG. 4 shows an illustrative environment 10 for managing the processes in accordance with the invention. To this extent, the environment 10 includes a computer infrastructure 12 that can perform the processes described herein. In particular, the computer infrastructure 12 includes a computing device 14 that comprises a tool 16, which makes computing device 14 operable to predict problematic areas for lithography in a circuit design.

In operation, the tool 16 (which may be in the form of software) uses CMP modeling data to predict areas of poor focus by mathematically mimicking the way in which a stepper (lithographic tool) decides the planes of best focus, e.g., process described herein. More specifically, the tool 16 will use the surface heights of the wafer, as modeled by the CMP modeling tool, and use this surface data to mathematically mimic the way in which the lithography tool decides its focus as it scans. This can be done by, for example, taking the modeling data and predicting an average focus offset for each field of exposure (all tiles within a slit) in three dimensions.

For example, in operation, the tool calculates a reasonable number of focal planes, e.g., 10 focal planes, for each tile in the reticle. In this way, each point (focal plane) would equal a certain percentage, e.g., 10%, of the exposure dose for the entire tile. These focal planes are a reflection of the surface irregularities in three dimensions, i.e., a three dimensional surface texture of the irregularity. Once each plane of exposure for each desired point in the reticle field is calculated, the tool 16 finds an average focus offset by calculating the average distance from the planes to the wafer surface along the axis of illumination which contribute to its exposure. The average focus offset can be put into a lithographic model to determine its importance such as, for example, how the image can be printed on the wafer. A more rigorous approach can be to break the exposure into a plurality of different exposures done in rapid sequence where each is an equal percentage of the total exposure dose and each with its own unique focus setting. The modeling can also take into account any known planarization effects that are due to films that are put onto the wafer after CMP but prior to lithography. For example, the films can be permanent films such as insulator films or sacrificial films such as resists.

Figure 1:
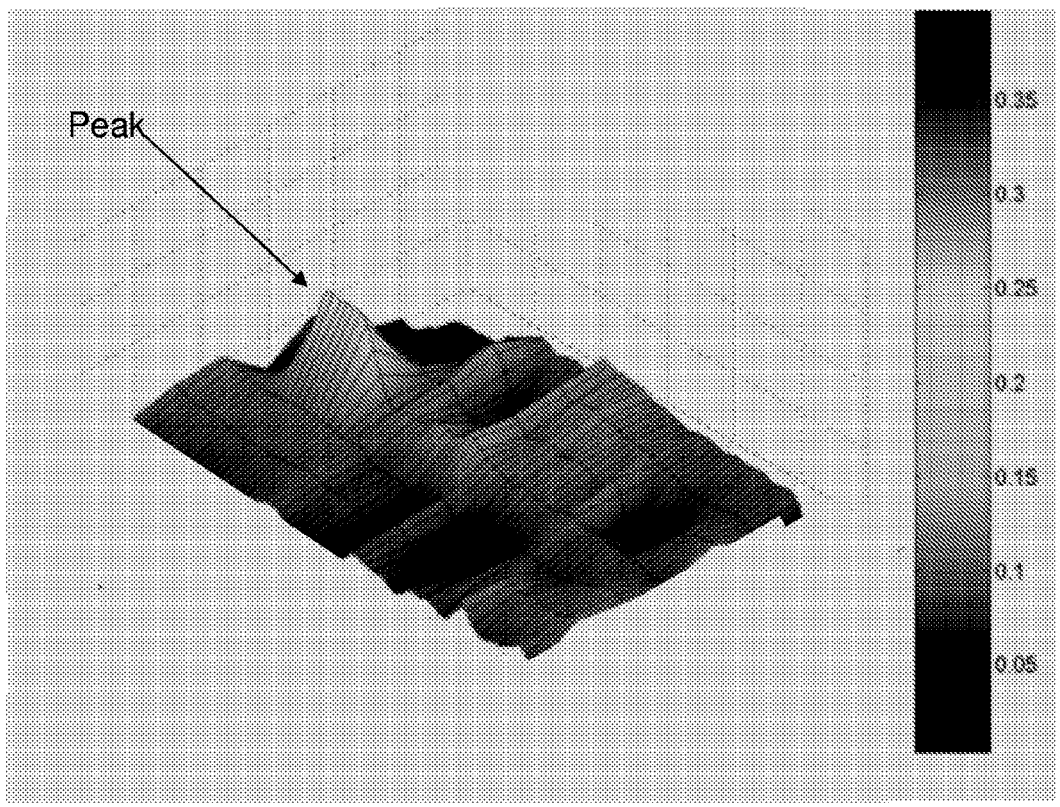
FIG. 1 shows a three dimensional surface map generated by a lithography tool prior to exposure of an upper metal level.
Figure 2:
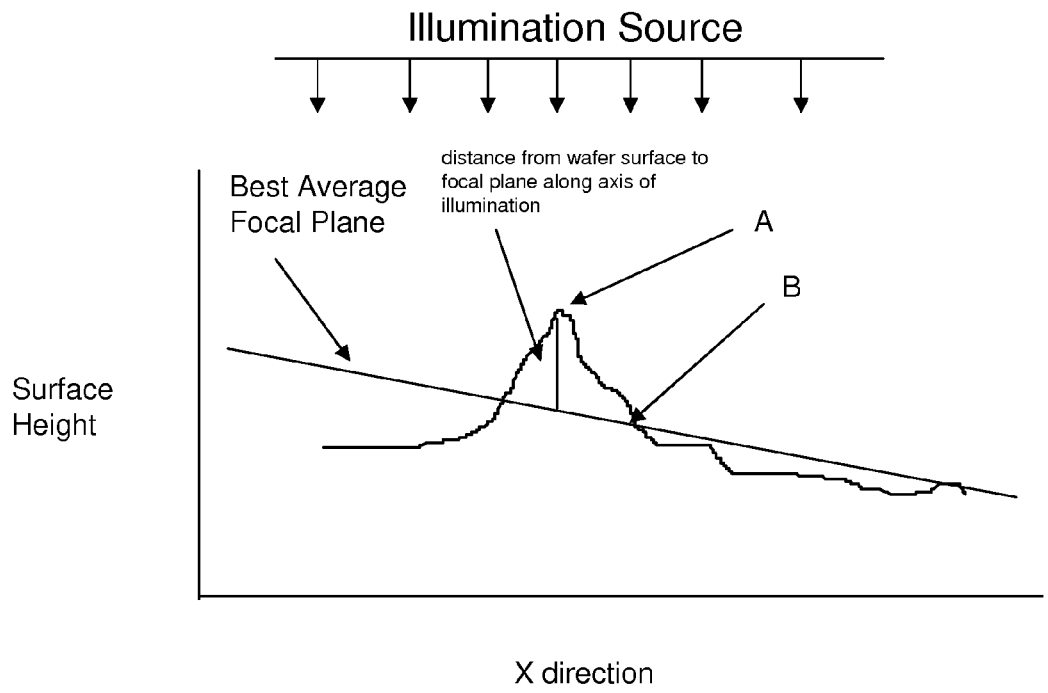
FIG. 2 shows a two dimensional surface profile, taken by measuring the surface height in FIG. 1.
Figure 3:
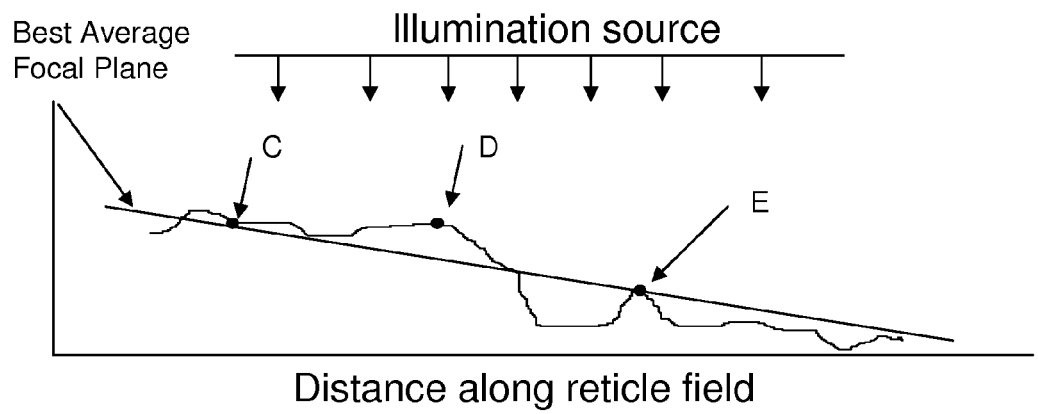
FIG. 3 shows a two dimensional surface profile.

In embodiments, using the above data, the tool 16 will identify tiles with an average focus offset (e.g., negative or positive) with a value above a certain specification distance related to the depth of focus for the lithography process. Thus, even if there is a same distance from the focal point, the tool 16 will identify different offsets which would otherwise contribute to the tool being out of focus. The information calculated by the tool 16, e.g., offset information, can be used to design a mask, which is used to fabricate the features on the wafer. That is, the system and method of the invention can use the information from the model, calculate offset data, and provide such offset data to a mask tool. In this way, the tool 16 identifies the problematic areas which can then be used to make a design change to the reticle. This can include eliminating the surface irregularities of the wafer, e.g., eliminate the bump of FIG. 1, ensuring that a best focal plane is used during exposure, or widening lines or moving critical areas to name just a few design choices.

The computing device 14 includes a processor 20, a memory 22A, an input/output (I/O) interface 24, and a bus 26. The memory 22A can include local memory employed during actual execution of computer program code, bulk storage, and cache memories which provide temporary storage of at least some computer program code in order to reduce the number of times the computer program code must be retrieved from bulk storage during execution. The program code implements the functionality of the tool 16. Further, the computing device 14 is in communication with an external I/O device/resource 28 and a storage system 22B. The external I/O device/resource 28 may be keyboards, displays, pointing devices, etc.

In general, the processor 20 executes the computer program code, which is stored in memory 22A and/or storage system 22B. While executing the computer program code, the processor 20 can read and/or write data to/from memory 22A, storage system 22B, and/or I/O interface 24. The bus 26 provides a communications link between each of the components in the computing device 14. The I/O device 28 can comprise any device that enables an individual to interact with the computing device 14 or any device that enables the computing device 14 to communicate with one or more other computing devices using any type of communications link.

The computing device 14 can comprise any general purpose computing article of manufacture capable of executing the computer program code installed thereon (e.g., a personal computer, server, handheld device, etc.). However, it is understood that the computing device 14 is only representative of various possible equivalent computing devices that may perform the processes described herein. To this extent, in embodiments, the functionality provided by the computing device 14 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 12 is only illustrative of various types of computer infrastructures for implementing the invention. For example, in embodiments, the computer infrastructure 12 comprises two or more computing devices (e.g., a server cluster) that communicate over any type of communications link, such as a network, a shared memory, or the like, to perform the process described herein. The communications link can comprise any combination of wired and/or wireless links; any combination of one or more types of networks (e.g., the Internet, a wide area network, a local area network, a virtual private network, etc.); and/or utilize any combination of transmission techniques and protocols.

CMP Modeling Data and Lithographic Tool

Figure 5:
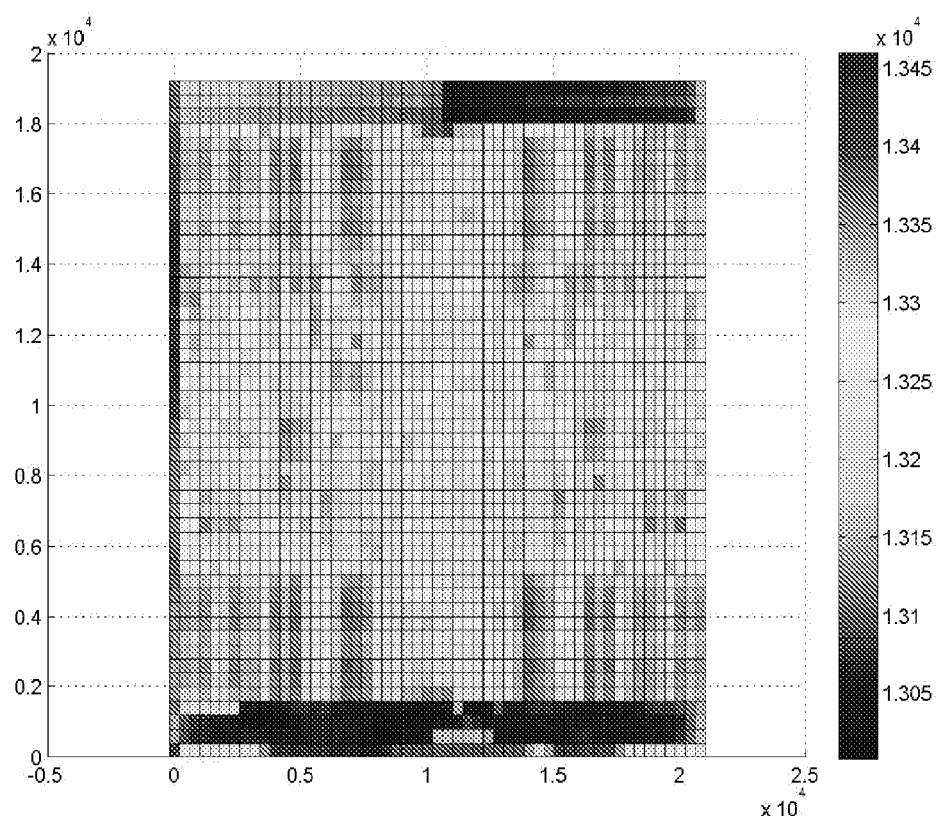
FIG. 5 shows a surface model of a wafer using a conventional CMP modeling tool.

FIG. 5 shows an exemplary surface model of a wafer using a conventional CMP modeling tool. More specifically, FIG. 5 shows a model of surface heights after M4 processing; although the model can be generated for any level, e.g., M1 polish, M2 polish, etc. As such, the modeling tool will take into account the details of the metal pattern at a particular level and also the underlying topography from prior levels.

By way of explanation, design data of a chip is fed into the modeling tool (after model setup/calibration is performed), and the model output is Cu thickness, dielectric thickness above a reference point, and surface height above a reference point, anywhere in the chip design. Typically the copper thickness, dielectric thickness, and surface height are mapped in terms of square regions of a specific size. In other words, the design is divided into a grid of squares (tiles) of a certain size. In implementing the conventional CMP modeling tool, the average thickness (copper), etc. is predicted for each individual tile.

The map of FIG. 5 includes the entire wafer field (chip and kerf (also known as the area between chips, e.g., dicing channel)). As seen in FIG. 5, there are high and low regions at the top and bottom of the field, which correspond to the kerf. It is not unusual for the kerf to have a different average metal density across many metal levels than the adjacent chip areas. There are also some surface height patterns visible within the chip which are a reflection of the fact that there are certain arrays or blocks within the chip that have some degree of pattern regularity. The surface height map of FIG. 5 may be generated prior to making the reticle or the wafer.

In implementation, the modeling data is used by the tool 16 of the invention to predict problematic areas (and/or calculate the best average focal plane for a particular slit to predict an average focus offset for each point in the reticle field). More specifically, using the exemplary surface model data of FIG. 5, the tool 16 can predict areas of poor focus by mathematically mimicking the way in which the lithographic tool decides planes of best focus. That is, by using the surface heights of the wafer, as modeled by the CMP modeling program, the tool can calculate a number of focal planes, e.g., 10 focal planes, for each tile, and use this calculated data to find an average focus offset. This average focus offset will represent an offset in three dimensional space, providing a more accurate evaluation of focus offset than conventional processes which only consider a height above some reference plane.

Figure 6:
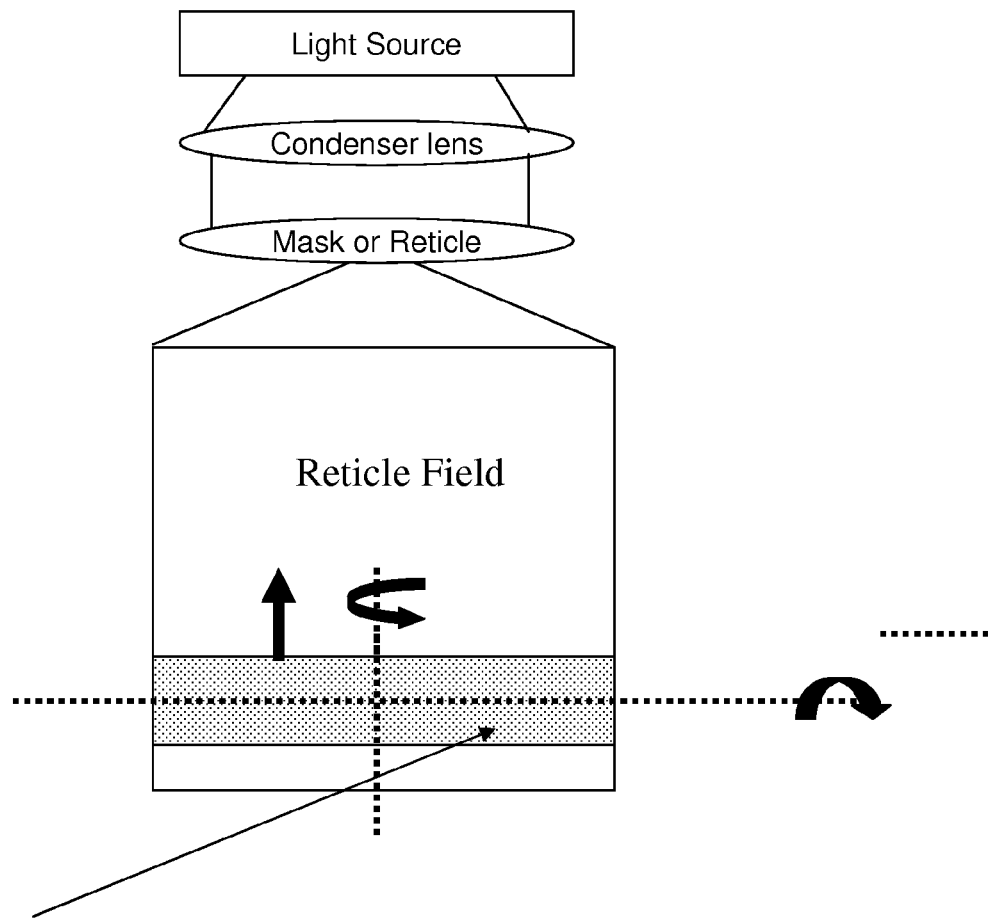
FIG. 6 shows an exemplary lithography tool used to expose wafers by scanning a slit in accordance with the invention.

FIG. 6 shows a highly illustrative lithography tool used to expose wafers by scanning a slit in accordance with the invention. In this example, the lithography tool includes a light source (lamp or laser) used to project light through a condenser lens. The condenser lens directs the light through the reticle or mask, which contains a pattern that represents the printed circuit features. The pattern on the mask is transferred to the wafer, in the reticle field. Using the data calculated by the tool 16, the exemplary lithography tool can scan along the reticle field in the direction of the arrow.

Figure 7:
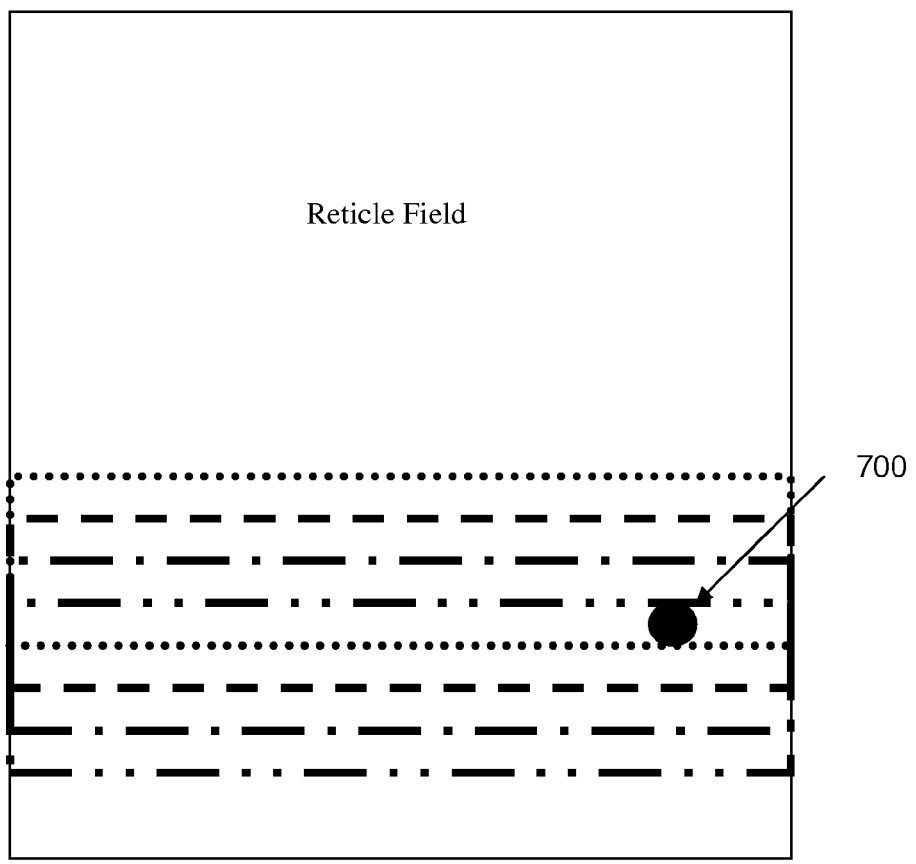
FIG. 7 shows a flow diagram implementing steps in accordance with the invention.

Even more specific, FIG. 7 shows an example of implementing the invention. In this example (not to scale), a reticle field is approximately 26×32 mm. To obtain the average focus offset for the area in the reticle field represented by area 700, the processes consider exposing this area with four different exposures, represented by the four different focal planes shown as different lines. This area can be representative of a tile of different dimensions such as, for example, 5×5 microns or 20×20 microns. Each of these exposures contribute one fourth of the total exposure dose. Also, each of the planes are translated with respect to the preceding plane by several mm; although in practice planes more closely spaced are contemplated by the invention and, as such, more than four planes contributing to the exposure would be provided, e.g., 10 planes or more. However, for illustrative clarity only four focal planes are shown; whereas, perhaps 10 focal planes spaced approximately 1 mm apart (although it should be understood that the spacing depends on the number of planes chosen and the slit width), each contributing one tenth of the exposure dose, would be used in practice. As those of skill in the art should understand, the more focal planes will provide a better average focal offset. One consideration, though, is that the more focal planes would require more computational time.

Illustrative Processes in Accordance with the Invention

Figure 8:
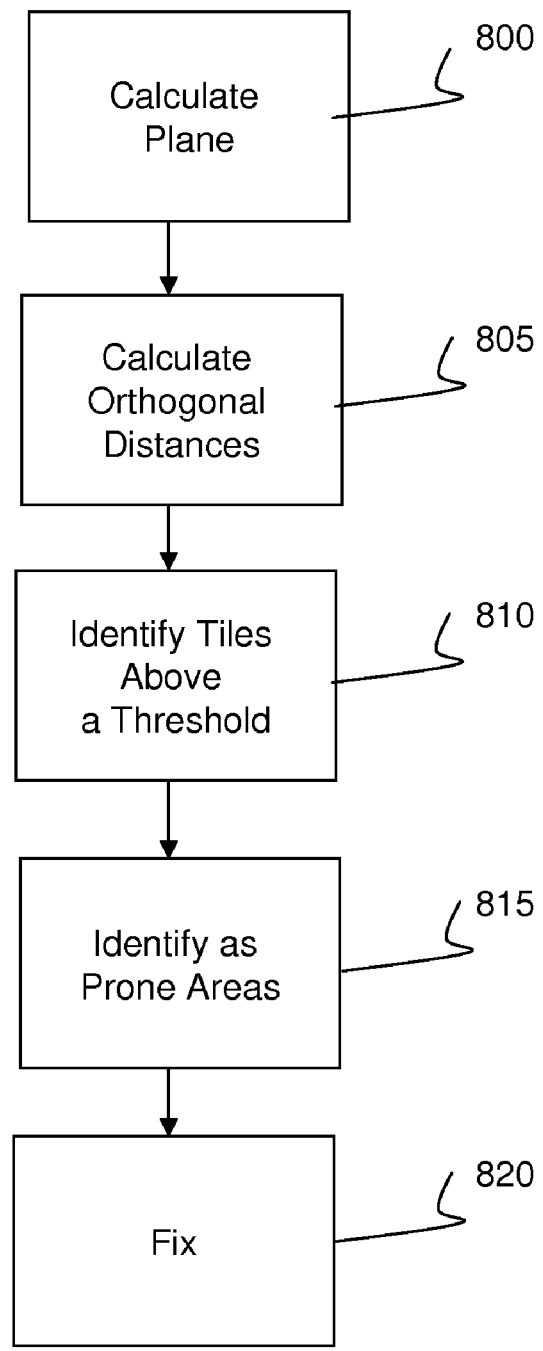
FIG. 8 is an exemplary illustration of the processes in accordance with the invention.

FIG. 8 shows a flow diagram implementing processes in accordance with the invention. FIG. 8 may also represent a high level block diagram implementing the functionality of the tool 16 shown in FIG. 4. The steps of FIG. 8 may be implemented and executed from either a server or in a client server relationship. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. The software and/or computer program product can be implemented in the environment of FIG. 4, as should be understood and capable of implementation by those of skill in the art. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and DVD.

Referring back to FIG. 8, at step 800, the surface height values within a slit are used to calculate the plane which best fits the surface height data. In embodiments, the processes will use all of the surface height values from tiles within a slit to calculate focal planes, alternatively, a predetermined number of values. The calculating of the planes can be done in much the same manner as a best straight line is determined to fit scattered points in two dimensions. For example, standard methods of determining and/or calculating the plane involve finding the plane which minimizes the sum of the orthogonal distances, or the sum of the squares of the orthogonal distances, from the plane. The act of mathematically calculating the best planes mimics the lithography tool's task of deciding the planes of best focus. The method of calculating the best planes for the surface data can be customized to more closely approximate the method in which the lithographic tool selects the best focal planes.

At step 805, the distance from the plane to the wafer surface along the axis of illumination for each tile is calculated (the distance can be to the center of each tile, or to the furthest edge or corner of each tile). This process repeats for many slits, along the reticle field. The distances along the axis of illumination from the tile to each focal plane which exposes it are then calculated. These distances are essentially focus offsets for each exposure. An average focus offset may then be calculated for that particular tile. If for example, four focal planes are used, and the focus offsets for the planes are −0.03 microns, −0.01 microns, +0.01 microns, and +0.02 microns (negative sign referring to planes below the wafer surface, and positive sign referring to planes above the wafer surface), then the average focus offset would be calculated as: the quantity (−0.03 −0.01 +0.01 +0.02) divided by 4 (the number of focal planes), which equals −0.0025 microns. All tiles with an average focus offset outside of a certain focus range (e.g., typically spanning from some negative focus value to a some positive focus value, with these values related to the depth of focus for the lithography process) could then be identified as potentially problematic areas for lithography.

A more rigorous method is to use a sufficiently complex photolithographic model which could simulate the response of a resist that is exposed to multiple (perhaps 10 or more) exposures in quick succession, each exposure using a different focus setting, each contributing an equal percentage of the total exposure dose. A sufficiently complex photolithographic model could also add some additional random component of focus latitude to simulate additional nonuniformities due to irregularities in the lithography tooling, wafer films, etc. The modeling can also take into account any known planarization effects that are due to films that are put onto the wafer after CMP but prior to lithography. The modeled developed resist images of the design shapes as predicted by the photolithographic model within each particular tile could then be examined for potential problem areas.

At step 810, all tiles are then identified which are above a certain specification distance (related to the depth of focus for the lithography process) from the mathematical planes. In embodiments, the identified tiles could be below or above the planes. At step 815, these tiles are identified as design areas which will be prone to lithography problems at the subsequent lithography levels.

In embodiments, a more exacting method is to compute, for each tile, an average focus offset by calculating its average orthogonal distance from many planes which contribute to its exposure, and identifying those tiles with an average focus offset (be it negative or positive) with a value above a certain specification distance which is related to the depth of focus for the lithography process. A more rigorous approach can be to break the exposure into a plurality of different exposures done in rapid sequence where each is an equal percentage of the total exposure dose and each with its own unique focus setting. As noted above, the modeling can also take into account any known planarization effects that are due to films that are put onto the wafer after CMP but prior to lithography.

In step 820, the problematic tiles identified are then "fixed" by changing the reticle design. The fixes can be made by adjusting metal patterns/densities, in that tile and possibly in other tiles (including dummy metal fill images), at the level at which the prediction is done or at one or more of the underlying metal levels, and then re-running the check to verify that the problem tiles have been fixed. In an alternate embodiment, another type of fix is to remove critical images in that tile (defined as images prone to poor printing when focus is off by the predicted average amount) at the next level and possibly at levels above. In this way, such images could be moved to other tiles with smaller predicted focus offsets. The critical images could be identified by running a separate lithographic simulation model, using as the nominal focus values the average focus offsets for each tile as determined by the processes described herein, plus a random component of focus latitude, in embodiments.

Circuit and Design Structure

Figure 9:
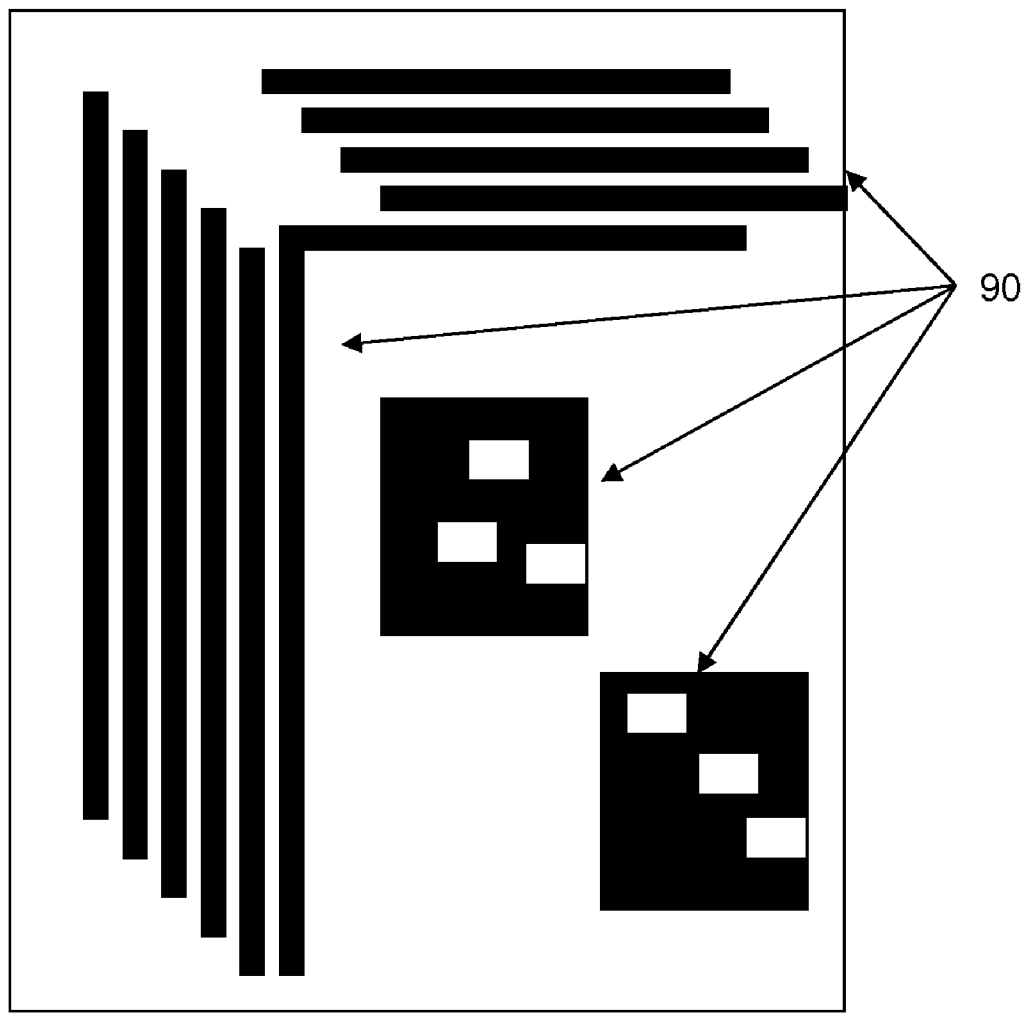
FIG. 9 is an exemplary circuit fabricated using the processes of the invention.

FIG. 9 is an exemplary circuit fabricated using the processes of the invention. This exemplary circuit includes features 90 which correspond to the patterns on a reticle, designed with the information obtained from the tool. The features will be better defined, compared to conventional system, as the reticle was in better focus to expose the pattern thereon, amongst other implementations as discussed herein.

The methods as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 10:
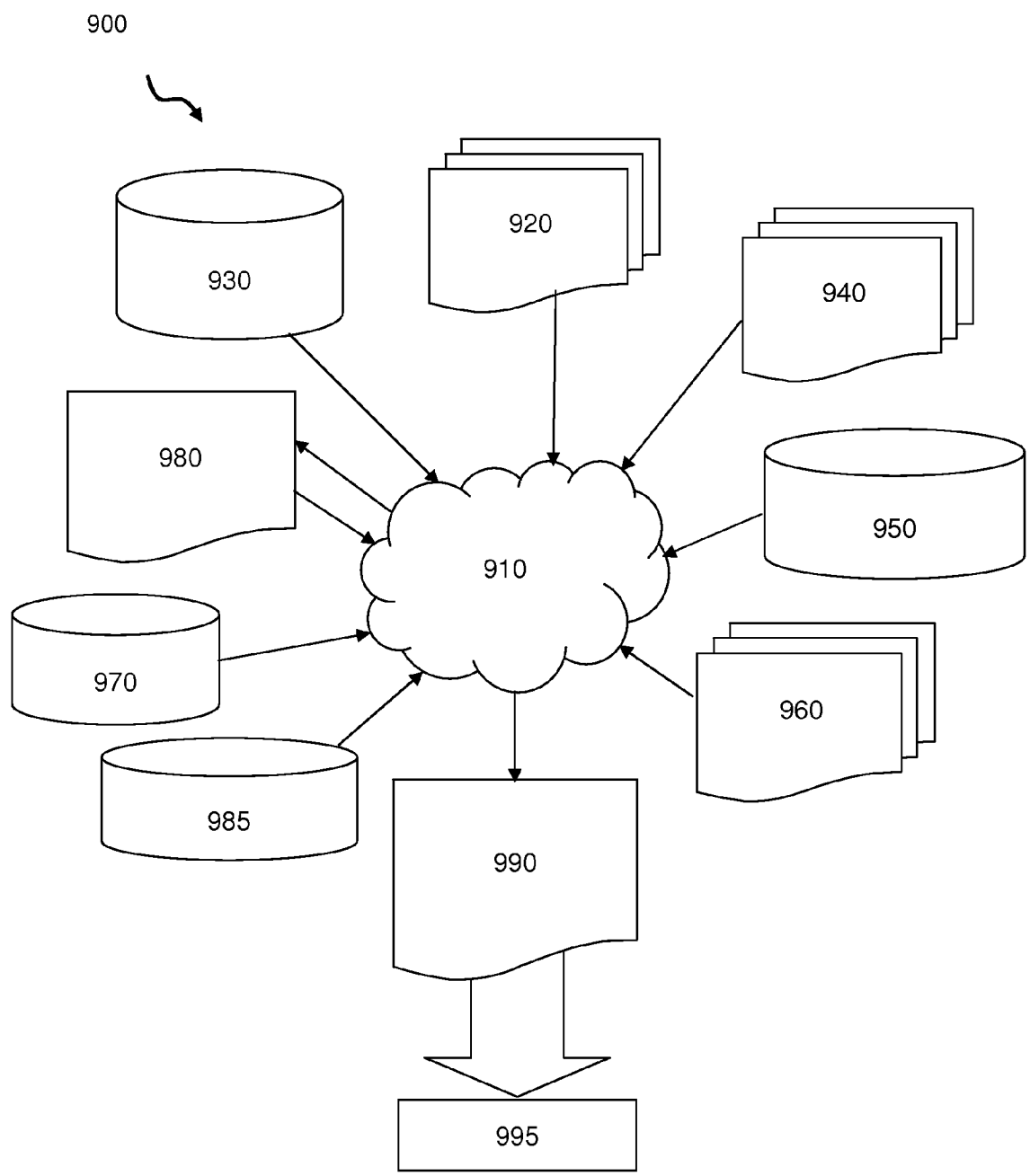
FIG. 10 is a flow diagram of a design process used in semiconductor design, manufacture, and/or test.

FIG. 10 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in FIG. 9 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in FIG. 9. Design process 910 preferably synthesizes (or translates) an embodiment of the invention as shown in FIG. 9 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in FIG. 9, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 9. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of embodiments, those of skill in the art will recognize that the invention can be practiced with modifications and in the spirit and scope of the appended claims.

What is claimed is:

1. A method of predicting problematic areas for lithography comprising:
    identifying, by a processor, surface heights of a plurality of tiles of a modeled wafer; and
    mathematically mimicking a lithographic tool to determine best planes of focus for exposure for the plurality of tiles,
    wherein an average distance of the surface heights is for a plurality of fields of exposure for each tile which is a three dimensional representation of a surface texture at a location on the modeled wafer.

2. The method of claim 1, wherein the identifying is performed by a modeling tool prior to reticle and wafer fabrication.

3. The method of claim 1, further comprising identifying tiles with an average focus offset with a value above a certain specification distance related to a depth of focus for a lithography process.

4. The method of claim 3, further comprising providing the calculated average offset data to a mask tool.

5. A method of predicting problematic areas for lithography comprising:
    identifying, by a processor, surface heights of a plurality of tiles of a modeled wafer; and
    mathematically mimicking a lithographic tool to determine best planes of focus for exposure for the plurality of tiles,
    wherein the identifying surface heights of the plurality of tiles determines a three dimensional texture of the modeled wafer.

6. A method of predicting problematic areas for lithography comprising:
    identifying, by a processor, surface heights of a plurality of tiles of a modeled wafer;
    mathematically mimicking a lithographic tool to determine best planes of focus for exposure for the plurality of tiles; and
    predicting an average distance of the surface heights if for a plurality of fields of exposure for each of the plurality of tiles comprises calculating a predetermined number of focal planes for each tile in a reticle field.

7. The method of claim 6, wherein each of the predetermined number of focal planes contributes to an equal percentage of exposure dose for an entire tile.

8. The method of claim 6, wherein the predetermined number of focal planes are used to measure surface irregularity in three dimensions.

9. The method of claim 6, wherein the predetermined number of focal planes are different planes of exposure.

10. The method of claim 6, wherein each of the plurality of fields of exposure is calculated to find an average focus offset by calculating an average distance along an axis of illumination from a best average focal plane.

* * * * *